(12) United States Patent
Wang et al.

(10) Patent No.: US 8,826,205 B2
(45) Date of Patent: Sep. 2, 2014

(54) METHOD FOR VERIFYING DIGITAL TO ANALOG CONVERTER DESIGN

(71) Applicant: Freescale Semiconductor, Inc., Austin, TX (US)

(72) Inventors: Cheng Wang, Suzhou (CN); Chao Liang, Suzhou (CN); Geng Zhong, Suzhou (CN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/965,201

(22) Filed: Aug. 13, 2013

(65) Prior Publication Data

US 2014/0115549 A1 Apr. 24, 2014

(30) Foreign Application Priority Data

Oct. 23, 2012 (CN) .......................... 2012 1 0404564

(51) Int. Cl.
*G06F 17/50* (2006.01)
*H03M 1/10* (2006.01)
(52) U.S. Cl.
CPC ............. *G06F 17/5036* (2013.01); *H03M 1/10* (2013.01)
USPC ........................................................ 716/107
(58) Field of Classification Search
CPC .................. G06F 2217/00–2217/86; G06F 17/50–17/509; G06F 17/5009; G06F 17/5036; G06F 17/5045

USPC .......................................................... 716/107
See application file for complete search history.

(56) References Cited

U.S. PATENT DOCUMENTS

| | | | |
|---|---|---|---|
| 6,996,513 B2 * | 2/2006 | Bellam | 703/14 |
| 7,076,415 B1 * | 7/2006 | Demler et al. | 703/14 |
| 7,941,771 B2 | 5/2011 | Kaszynski et al. | |
| 8,099,271 B2 | 1/2012 | Schubert et al. | |

OTHER PUBLICATIONS

Miloslav Kubar, Ondrej Subrt, Iirf Iakovenko and Pravoslav Martinek, "Versatile Engine for Virtual Testing of ADC/DAC Non-Linearities", 2010 XIth International Workshop on Syrnbolic and Nurnerical Methods, Modeling and Applications to Circuit Design, 2010.

\* cited by examiner

*Primary Examiner* — Jack Chiang
*Assistant Examiner* — Brandon Bowers
(74) *Attorney, Agent, or Firm* — Charles Bergere

(57) ABSTRACT

A method for producing a verified design of a digital to analog converter (DAC) starts with providing an HDL representation of the DAC. Numerical values of the analog output signal as a function of the representation of the DAC for a range of numerical values of the digital input signal are simulated with a simulator. A model is used for converting the simulated numerical values of the analog output signal to numerical values of an equivalent model signal in the same digital format as the input signal. A comparator compares the numerical values of the input signal and the model signal and determines differences greater than a defined tolerance.

14 Claims, 4 Drawing Sheets

ADC MODEL 108

```
`INCLUDE "CONSTANTS.VAMS"  ⎫
`INCLUDE "DISCIPLINES.VAMS" ⎬ 300
                            ⎭

MODULE VOLTAGE_MOTHER_ADC (ADC_TRIGGER, VOLTAGE_INPUT, VSUPPLY, DATA_OUT); ⎫
INPUT ADC_TRIGGER;                                                         ⎪
INPUT VOLTAGE_INPUT, VSUPPLY;                                              ⎬ 302
ELECTRICAL VOLTAGE_INPUT, VSUPPLY;                                         ⎪
OUTPUT [`DACO_ADC_DATA_WIDTH-1:0] DATA_OUT;                                ⎭

PARAMETER DACO_ADC_DATA_WIDTH  12                           ⎫
PARAMETER DACO_MSB       (1<<`DACO_ADC_DATA_WIDTH) - 1      ⎬ 304
PARAMETER DACO_LSB       1/(1<<`DACO_ADC_DATA_WIDTH)        ⎭

REAL VOLTAGE_INPUT_REAL;  ⎫
REAL VALUE_PRE;           ⎬ 306
REAL VSUPPLY_REAL;        ⎪
INTEGER VALUE;            ⎭

INITIAL BEGIN
    VOLTAGE_INPUT_REAL = 0.0;
    VALUE_PRE = VOLTAGE_INPUT_REAL / (`DACO_LSB * VSUPPLY_REAL);
    VALUE = (VALUE_PRE > `DACO_MSB) ? `DACO_MSB : VALUE_PRE;
END

ALWAYS @(POSEDGE ADC_TRIGGER)                                        ⎫
BEGIN                                                                ⎪
    VOLTAGE_INPUT_REAL = V(VOLTAGE_INPUT) /1;                        ⎬ 310
    VALUE_PRE = VOLTAGE_INPUT_REAL / (`DACO_LSB * VSUPPLY_REAL);     ⎪
        VALUE = (VALUE_PRE > `DACO_MSB) ? `DACO_MSB : VALUE_PRE;     ⎭
END

ASSIGN DATA_OUT[`DACO_ADC_DATA_WIDTH-1:0] = VALUE;   ~312

ANALOG BEGIN              ⎫
  VSUPPLY_REAL = V(VSUPPLY); ⎬ 314
END                       ⎭

END MODULE ~316
```

FIG. 3

```
SELF COMPARATOR 110

MODULE SELF_MEASUREMENT (DAC_DATA_IN, ADC_DATA_OUT, ADC_TRIGGER);   ⎫
PARAMETER ADC_DATA_WIDTH = 12;                                       ⎬ 400
PARAMETER OFFSET = 1;                                                ⎪
PARAMETER CHECK_DELAY = 1000;                                        ⎭

INPUT [ADC_DATA_WIDTH-1:0] DAC_DATA_IN, ADC_DATA_OUT;   ⎫
OUTPUT                     ADC_TRIGGER;                 ⎬ 402

REG ADC_TRIGGER;                                        ⎫
                                                        ⎪
INITIAL BEGIN                                           ⎪
  ADC_TRIGGER = 1'B0;                                   ⎪
END                                                     ⎪
                                                        ⎬ 404
ALWAYS @(DAC_DATA_IN)                                   ⎪
BEGIN                                                   ⎪
  #DELAY ADC_TRIGGER = 1'B1;                            ⎪
  #10 ADC_TRIGGER = 1'B0;                               ⎪
END                                                     ⎭
                                                              406
ALWAYS @(REGEDGE ADC_TRIGGER)                           ⎫
  IF (((DAC_DATA - OFFSET) <= ADC_DATA_OUT) || ((DAC_DATA_IN + OFFSET) >= ADC_DATA_OUT))
    $DISPLAY ("ERROR!! DAC OUTPUT CHECK FAIL");         ⎬
  ELSE                                                  ⎪
    $DISPLAY ("INFO!! DAC OUTPUT CHECK SUCCESS");       ⎭

END MODULE  ~408
```

FIG. 4

METHOD FOR VERIFYING DIGITAL TO ANALOG CONVERTER DESIGN

BACKGROUND OF THE INVENTION

The present invention is directed to design and verification of electronic circuits and, more particularly, to a method for verifying the design of a digital to analog converter.

Electronic design automation (EDA) tools are often used to design and verify integrated circuits (ICs), which may include many different types of modules. Hardware description languages (HDLs) are languages used to describe IC designs, their operation and their relation within the IC. A common HDL used for digital circuits is Verilog, which is standardized as IEEE 1364, and a common HDL used for analog and mixed signal (AMS) circuits are Verilog-AMS, which has an option digital-centric mixed signal verification, called the DMS option, and VHDL which is standardized as IEEE standard 1076.1-1999. Verification includes verifying the performance that will result from the IC structure and its modules and elements, and the electrical characteristics chosen for the modules and elements and their inter-relations.

A digital to analog converter (DAC) receives a digital input signal and produces an analog output signal of equivalent value. Verifying the performance of a DAC at the design stage avoids the need to synthesize the real hardware modules and elements, and to manufacture and test physical prototypes, which are laborious, expensive and time-consuming tasks and in addition leave ambiguity between design imperfections and manufacturing imperfections. Using a HDL representation of a DAC, the performance to be expected from its design can be verified using a simulator or checker, which mathematically calculates the performance characteristics to be expected from the detailed design. The simulation and the verification can then be iterated for variants of the design. However, if the simulation has to be configured to run different cases of input signal ranges, and the corresponding expected output signals in accordance with the specification have to be calculated prior to the simulation, the verification process is inconvenient and slow.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale.

FIG. 3 is one example of a list of instructions of a program model for converting simulated numerical values of a DAC output signal to numerical values of an equivalent model signal in the same digital format as the input signal of the DAC; and FIG. 4 is one example of a list of instructions in a program for comparing the numerical values of the input signal and the model signal produced by the model of FIG. 3.

DETAILED DESCRIPTION OF THE INVENTION

Figure 1:
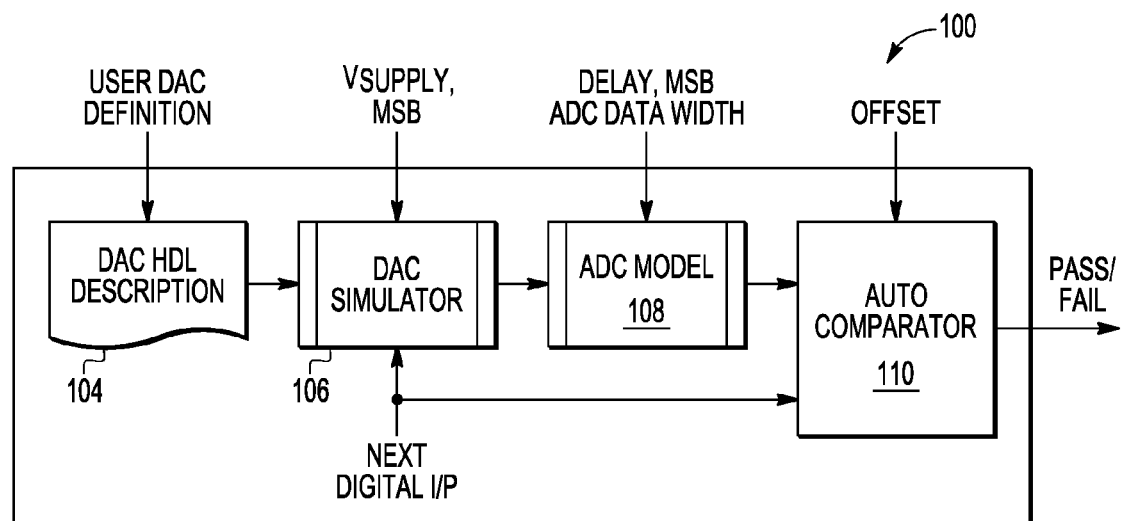
FIG. 1 is a schematic block diagram of a computer system for simulating and verifying the operation of the design of a DAC in accordance with one embodiment of the invention, given by way of example.
Figure 2:
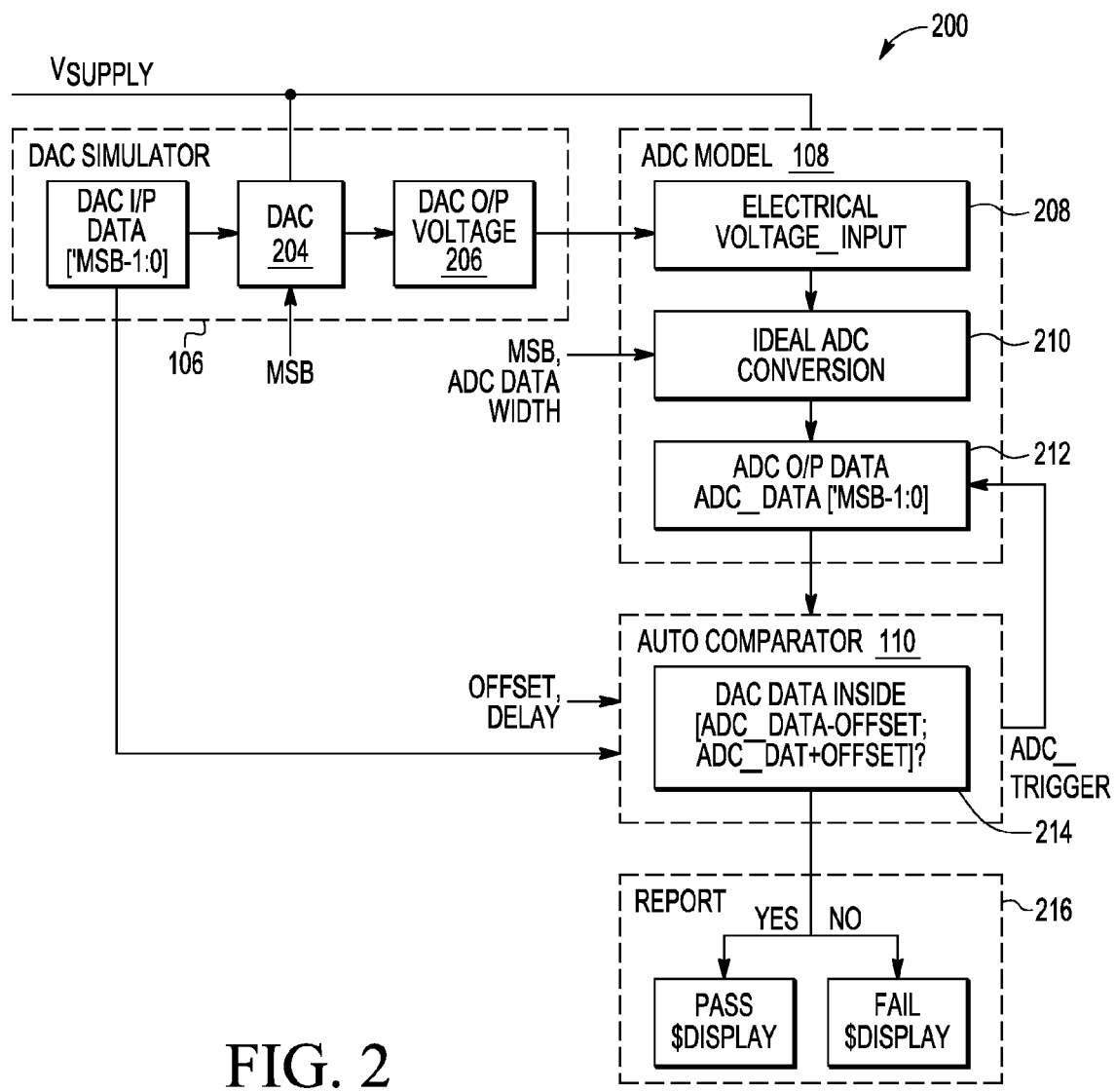
FIG. 2 is a schematic block diagram illustrating operations performed by the computer system of FIG. 1 in a method of simulating and verifying the operation of the design of a DAC in accordance with one embodiment of the invention, given by way of example.

FIGS. 1 and 2 illustrate a computer system for executing a program 100 and a method 200 for producing a verified design of a digital to analog converter (DAC) that converts a digital input signal DAC_IN to an analog output signal DAC_OUT. The program 100 comprises instructions contained in a non-transitory machine-readable memory and executable by a computer system 102. The program 100 and method 200 comprise providing a hardware description language (HDL) representation 104 of the DAC. A simulator 106 simulates numerical values of the output signal DAC_OUT as a function of the HDL representation 104 of the DAC for a range of numerical values of the input signal DAC_IN. A model 108 is used for converting the simulated numerical values of the output signal DAC_OUT to numerical values of an equivalent model signal ADC_OUT in the same digital format as the input signal DAC_IN. A comparator 110 compares the numerical values of the input signal DAC_IN and the model signal ADC_OUT and generates differences greater than a defined tolerance. Note, in the description and drawings, input signals also may be denoted with I/P and output signals with O/P.

In this example, the HDL representation 104 is in Verilog AMS language, which may use the DMS option. The simulator 106, the model 108 and the comparator 110 are a non-synthesis part of a system Verilog checker. Parameters of the simulator 106 relating to digital signal width, reference voltage and accuracy of the DAC are configured by a user. In this example, the model 108 is an ADC and the comparator 110 compares a difference at a defined time between the numerical value of the model signal and the numerical value of the input signal, in digital format, with the defined tolerance. The defined time is a time relative to a change in the numerical value of the input signal.

In more detail, as shown in FIG. 1, the program 100 comprises instructions executable by the computer system 102 and contained in a non-transitory machine-readable medium in the computer system 102. The HDL representation 104 of the DAC being designed and verified is input to the system 102 (e.g., such as manually by the user), along with design parameters such as the intended voltage supply $V_{SUPPLY}$ and most significant bit ('MSB') of the DAC and ADC, the data width and delay for operation of the ADC model 108, and the maximum offset to be tolerated between the model signal ADC_OUT and the input signal DAC_IN. The verification is embedded in the Verilog checker and is performed automatically when selected by the user. The user can then make variations in the design and verify the performance of the variations.

It will be appreciated that various methods are available for the preparation of the HDL representation 104 and any suitable method may be used to provide the HDL representation 104.

Referring now to FIG. 2, the method 200 also includes the steps of simulating numerical values of the output signal DAC_OUT in the simulator 106, converting the simulated numerical values of the output signal DAC_OUT to numerical values of the equivalent model signal ADC_OUT in the ADC model 108 and comparing the numerical values of the input signal DAC_IN and the model signal ADC_OUT in the comparator 110. Numerical values representing the range of input signals DAC_IN from its maximum MSB-1 to 0 are applied to the simulator 108 in succession at 202. The simulator 106 calculates the numerical values of the corresponding output voltage DAC_OUT as a function of the parameters entered by the user at 204 and provides numerical values at 206 to the ADC model 108.

The ADC model 108 receives the numerical values of the corresponding output voltage DAC_OUT at 208 and also receives the numerical value of the voltage supply $V_{SUPPLY}$. At 210, the ADC model 108 calculates the numerical values of the equivalent ideal model signal ADC_OUT in the same digital format as the input signal DAC_IN, as a function of parameters such as the data width and delay for functioning of the ADC model 108, which are entered by the user. The ADC model 108 provides the model signal ADC_OUT at 212.

The comparator 110 determines the difference between the numerical values of the digital input signal DAC_IN from step 202 and the digital model signal ADC_OUT from step 212 at a time defined by the parameter DELAY at 214. The comparator 110 has a tolerance value OFFSET, which in one embodiment is set by the user, when doing the comparison and determining the difference. At 216 a display indicates whether the offset in the numerical value is greater than the defined tolerance by displaying pass or fail.

FIG. 3 illustrates an example of a program module that can be used to implement the voltage monitor ADC model 108 in Verilog-AMS language. At 300, existing databases of constants and disciplines are specified. At 302, input variables adc_trigger, voltage_input, and vsupply used in the model ADC calculations are defined, as well as an output variable data_out. At 304, values of parameters daco_ADC_DATA_WIDTH, daco_MSB and daco_LSB used in the calculations are defined. At 306, the values of input variables voltage_input_real and vsupply_real and an intermediate variable value_pre used in the calculations are specified to be those derived from the real DAC described by the HDL description 104, in integer numerical values. At 308, the initial values for the input and intermediate variables of the calculation are set. At 310, the calculation is specified to iterate at the positive edges of the input adc_trigger. The intermediate variable value_pre is calculated as a function of the voltage output of the DAC which is input to the ADC as voltage_input_real and of the reference voltage input as vsupply_real. The value of the variable value_pre is substituted for the current value of daco_MSB when it becomes greater than daco_MSB and is then assigned as the output of the ADC at 312. The model is specified at 314 to use continuously in the calculations a voltage supply vsupply_real equal to the voltage supply V(vsupply). The module ends at 316.

FIG. 4 illustrates an example of a program module that can be used to implement the self measurement (auto comparator) 110 in Verilog-AMS language. At 400, values of parameters ADC_DATA_WIDTH, OFFSET and CHECK_DELAY used in the calculations are specified and their values defined. At 402, the values of input variables dac_data_in, adc_data_out used in the comparator are defined to be the digital input used in the simulation 106 of the real DAC, and the corresponding output of the calculations of the ADC 108, in numerical values. The output of the auto comparator 110 is specified to be the trigger adc_trigger. At 404 the trigger adc_trigger is defined as a single-digit binary number, initially zero, whose positive edge occurs after the time delay DELAY from a change of the input dac_data_in and whose negative edge occurs one time element later. At 406, the routine specifies that if the difference between the input values dac_data_in and adc_data_out at the moment of the negative edge of the trigger adc_trigger is greater than the parameter OFFSET 'fail' is displayed and if the difference is smaller, 'success' is displayed. The module ends at 408.

The self-measurement (ADC model) 108 and auto comparator 110 modules are embedded into the Verilog AMS DAC design and simulation tool, for example by a program element as follows, for example:

```
'ifdef AMS_SIMULATION
    voltage_monitor_adc DACO_CHECK_EXT
    # (.DAC_WIDTH        (12),
       .OFFSET           (1),
       .DELAY            (1000)) (
       .voltage_input(daco),
       .vsupply(vref_ext))
'endif
```

Figure 5:
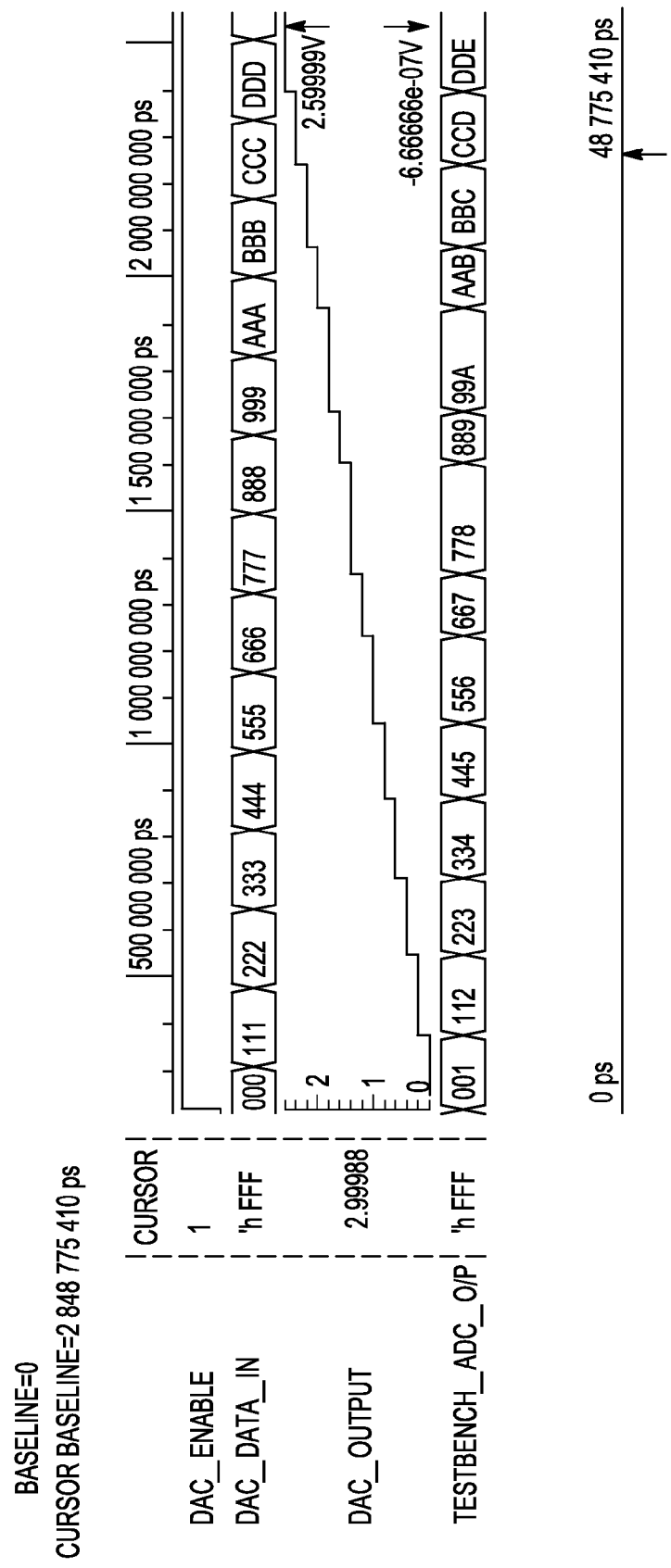
FIG. 5 a graph illustrating wave forms corresponding to input and output signals of the DAC and a model in accordance with an embodiment of the present invention.

FIG. 5 illustrates graphically values simulated and verified using the program and method of the present invention, over time. The waveforms DAC_DAT_In and Testbench_ADC_output (corresponding respectively to data_out and adc_data_out in FIGS. 3 and 4) show the least-significant bits (LSBs) of the values and therefore indicate the timing of the changes in the corresponding values. The values are specified to range from 11 to 0 in hexadecimal notation and the numbers in the waveforms show the values multiplied by 10 in hexadecimal notation. The waveform DAC_OUTPUT illustrates the analog value of the DAC voltage output. It can be seen that the steps in the waveform DAC_OUTPUT and the corresponding changes in the digital output of the ADC 108 Testbench_ADC_output are offset from the changes in the digital input DAC_DAT_In to the DAC 204, due to the imperfections in the simulated DAC 204 as described in the HDL description 104. The comparator 110 determines whether or not these offsets in time are within the tolerance OFFSET defined by the user at the moment defined by the trigger adc_trigger after the time delay DELAY from a change of the input dac_data_in.

The verification is performed with the EDA tools automatically, without the need to calculate previously the expected output voltages of the ideal DAC for different input values, and without any other change necessary to the design tools. The method and program can be used in different verification environments, such as AMS based SOC verification with or without the DMS option, module level verification and transistor-level simulation.

The method of the invention may be implemented at least partially in a non-transitory machine-readable medium containing a computer program for running on a computer system, the program at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on non-transitory computer readable media permanently, removably or remotely coupled to an information processing system.

The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc., and data transmission media including computer networks, point-to-point telecommunication equipment, and carrier wave transmission media, just to name a few.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

The terms "assert" or "set" and "negate" (or "de-assert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. Similarly, any arrangement of components to achieve the same functionality is effectively "associated" such that the desired functionality is achieved. Hence, any two components combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

The invention also is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

In the claims, the word 'comprising' or 'having' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A method of producing a verified design of a digital to analog converter (DAC), wherein the DAC converts a digital input signal to an analog output signal, the method comprising:
   providing a hardware description language (HDL) representation of the DAC;
   using a simulator for simulating numerical values of the analog output signal as a function of said representation of said DAC for a range of numerical values of the digital input signal and generating simulated numerical values of the analog output signal;
   using a model for converting the simulated numerical values of the analog output signal to numerical values of an equivalent model output signal in a same digital format as the digital input signal, wherein said converting is performed by a computer system; and
   comparing the numerical values of the digital input signal and the model output signal and detecting numerical value differences greater than a defined tolerance, wherein said comparing and detecting are performed by the computer system.

2. The method of claim 1, wherein said HDL representation is in Verilog-AMS language.

3. The method of claim 2, wherein said simulating, said model and said comparing are a non-synthesis part of a system Verilog checker.

4. The method of claim 2, wherein parameters of said simulator relating to digital signal width, reference voltage and accuracy of said converter are configured by a user.

5. The method of claim 1, wherein said model is an analog-to-digital converter (ADC).

6. The method of claim 5, wherein said comparing compares a difference at a defined time between the numerical value of the model output signal and the numerical value of the digital input signal with said defined tolerance.

7. The method of claim 6, wherein said defined time is a time relative to a change in the numerical value of the digital input signal.

8. A non-transitory machine-readable medium containing instructions executable by a computer system, wherein the instructions operate on a hardware description language (HDL) representation of a digital to analog converter (DAC) for converting a digital input signal to an analog output signal, wherein the instructions perform the steps of:

simulating numerical values of the analog output signal as a function of the HDL representation of the DAC for a range of numerical values of the digital input signal and generating simulated numerical values of the analog output signal;

converting the simulated numerical values to numerical values of an equivalent model output signal having a same format as the digital input signal; and comparing the numerical values of the input signal and the model output signal, and determining differences greater than a defined tolerance.

9. The non-transitory machine-readable medium of claim 8, wherein said HDL representation is in Verilog-AMS language.

10. The non-transitory machine-readable medium of claim 9, wherein the simulating, the converting, and the comparing are performed by a non-synthesis part of a system Verilog checker.

11. The non-transitory machine-readable medium of claim 9, wherein parameters of the simulating relating to digital signal width, reference voltage and accuracy of said DAC are user-configurable.

12. The non-transitory machine-readable medium of claim 8, wherein an analog-to-digital converter (ADC) is used to convert the simulated numerical values to the numerical values of the equivalent model output signal.

13. The non-transitory machine-readable medium of claim 12, wherein the comparator compares a difference at a defined time between the numerical value of the model output signal and the numerical value of the input signal in digital format with said defined tolerance.

14. The non-transitory machine-readable medium of claim 13, wherein said defined time is a time relative to a change in the numerical value of the input signal.

\* \* \* \* \*